(12) United States Patent
Nguyen et al.

(10) Patent No.: US 6,917,755 B2
(45) Date of Patent: Jul. 12, 2005

(54) SUBSTRATE SUPPORT

(75) Inventors: Andrew Nguyen, San Jose, CA (US); Gerhard Schneider, Cupertino, CA (US); Akihiro Hosokawa, Cupertino, CA (US); Takayuki Matsumoto, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 128 days.

(21) Appl. No.: 10/376,857

(22) Filed: Feb. 27, 2003

(65) Prior Publication Data

US 2004/0170407 A1 Sep. 2, 2004

(51) Int. Cl.⁷ .................................................. F26B 3/30
(52) U.S. Cl. ........................ 392/418; 219/390; 219/405; 219/411; 392/418; 118/724; 118/725; 118/50.1; 118/728; 118/730; 414/217; 384/48; 193/35 B; 401/215
(58) Field of Search .................................. 219/390, 405, 219/411; 392/416, 418; 118/724, 725, 50.1, 728–730; 414/217; 384/44, 48–50, 52–53; 193/35 B, 35 MD

(56) References Cited

U.S. PATENT DOCUMENTS

| | | | |
|---|---|---|---|
| 4,108,455 A | * 8/1978 | James | 280/43.23 |
| 4,736,508 A | 4/1988 | Poli et al. | 29/445 |
| 4,848,814 A | 7/1989 | Suzuki et al. | 294/1.1 |
| 4,958,061 A | 9/1990 | Wakabayashi et al. | 219/411 |
| 5,288,329 A | * 2/1994 | Nakamura et al. | 118/729 |
| 5,445,486 A | 8/1995 | Kitayama et al. | 414/416 |
| 5,605,574 A | 2/1997 | Tsunashima et al. | 118/500 |
| 5,677,824 A | 10/1997 | Harashima et al. | 361/234 |
| 5,718,574 A | 2/1998 | Shimazu | 432/253 |
| 5,788,304 A | 8/1998 | Korn et al. | 294/159 |
| 5,836,575 A | 11/1998 | Robinson et al. | 269/317 |
| 5,850,071 A | 12/1998 | Makiguchi et al. | 219/390 |
| 5,931,631 A | 8/1999 | Bonora et al. | 414/416 |
| 5,984,391 A | 11/1999 | Vanderpot et al. | 294/1.1 |
| 6,077,026 A | 6/2000 | Shultz | 414/744.1 |
| 6,085,670 A | 7/2000 | Genov | 108/147 |

(Continued)

FOREIGN PATENT DOCUMENTS

| | | | |
|---|---|---|---|
| JP | 09-129567 | 5/1994 | ............. H01L/21/22 |
| JP | 2000-091406 | 3/2000 | ............. H01L/21/68 |
| JP | 2000-150402 | 5/2000 | ............. H01L/21/22 |
| WO | WO 02/095808 A1 | 11/2002 | ............. H01L/21/00 |

OTHER PUBLICATIONS

U.S. Appl. No. 10/379,520, filed Mar. 4, 2003, Bagley et al.
U.S. Appl. No. 09/970,546, filed Oct. 3, 2001, Hosokawa.

*Primary Examiner*—Shawntina Fuqua
(74) *Attorney, Agent, or Firm*—Moser, Patterson & Sheridan LLP

(57) ABSTRACT

An apparatus for supporting a substrate is described that has a ball adapted to minimize damage between the substrate support and the substrate supported thereon. In one embodiment, an apparatus for supporting a substrate includes ball disposed on an inclined ball support surface. The ball support surface is adapted to bias the ball toward one side of the ball support surface thereby providing space for the ball to roll as the substrate supported thereon changes in length when exposed to thermal influences. In another embodiment, the apparatus further comprises a cage adapted to capture the ball to the ball support surface.

92 Claims, 11 Drawing Sheets

U.S. PATENT DOCUMENTS

| | | | |
|---|---|---|---|
| 6,091,498 A | 7/2000 | Hanson et al. | 356/375 |
| 6,110,285 A | 8/2000 | Kitazawa et al. | 118/715 |
| 6,143,147 A | 11/2000 | Jelinek | 204/298.15 |
| 6,146,504 A | 11/2000 | Patadia et al. | 204/192.12 |
| 6,187,134 B1 | 2/2001 | Chow et al. | 156/345 |
| 6,193,506 B1 | 2/2001 | Muka | 432/241 |
| 6,204,483 B1 * | 3/2001 | Fair et al. | 219/388 |
| 6,213,704 B1 | 4/2001 | White et al. | 414/217 |
| 6,256,555 B1 | 7/2001 | Bacchi et al. | 700/245 |
| 6,257,827 B1 | 7/2001 | Hendrickson et al. | 414/805 |
| 6,322,116 B1 | 11/2001 | Stevens | 294/64.3 |
| 6,343,183 B1 | 1/2002 | Halpin et al. | 392/416 |
| 6,345,150 B1 | 2/2002 | Yoo | 392/418 |
| 6,371,716 B1 | 4/2002 | Byun et al. | 414/416.03 |
| 6,528,767 B2 | 3/2003 | Bagley et al. | 219/390 |
| 2003/0072639 A1 | 4/2003 | White et al. | 414/217 |

* cited by examiner

SUBSTRATE SUPPORT

This application relates to U.S. patent application Ser. No. 09/963,020, filed Sep. 24, 2001, and U.S. patent application Ser. No. 09/982,406, filed Oct. 17, 2001, which are hereby incorporated by reference in their entirety.

BACKGROUND OF THE INVENTION

1. Field of the Invention

Embodiments of the invention relate to a substrate support.

2. Description of the Related Art

Thin film transistors have been made heretofore on large glass substrates or plates for use in monitors, flat panel displays, solar cells, personal digital assistants (PDA), cell phones, and the like. The transistors are made by sequential deposition of various films including amorphous silicon, both doped and undoped silicon oxides, silicon nitride, and the like in vacuum chambers. One method utilized for deposition of thin films is chemical vapor deposition (CVD).

CVD is a comparatively high temperature process requiring that substrates withstand temperatures on the order of 300 degrees Celsius to 400 degrees Celsius, with temperatures exceeding 500 degrees Celsius on developing. CVD film processing has found widespread use in the manufacture of integrated circuits on substrates. However, since the glass substrate is a dielectric material that is very brittle and is subject to sagging, warping or cracking when heated to high temperatures, care must be taken to avoid thermal stress and resulting damage during heating and cooling.

Systems exist currently to preheat substrates prior to processing and to conduct post-processing heat treatment operations. Conventional heating chambers have one or more heated shelves for heating an individual or a plurality of glass substrates. The glass substrate is typically supported above a shelf on spacers to improve heat uniformity and throughput. To minimize costs, conventional spacers are typically formed from easily machined metals, such as stainless steel, aluminum, aluminum nitride, and the like. However, conventional spacers may mar or otherwise damage the surface of the glass substrate, possibly resulting in imperfections in the glass surface. For example, annealing to produce low temperature polysilicon film requires heating the glass substrate to about 550 degrees Celsius, which can cause about 4 mm of thermal expansion in a 900 mm wide substrate. This thermal expansion results in the glass substrate sliding across the spacers on which the glass substrate is supported during heating and cooling. The resulting friction between the glass substrate and spacers has been shown to cause scratches, cracks, and other deformation defects in the glass substrates. For example, substrates may break along a scratch or other defect instead of along a desired location during cleaving processes that divide the substrate into multiple panels, rendering one or more panels defective.

Therefore, there is a need for a support that reduces substrate damage during processing.

SUMMARY OF THE INVENTION

An apparatus for supporting a substrate is provided having a ball adapted to minimize damage between the substrate support and the substrate supported thereon. In one embodiment, an apparatus for supporting a substrate includes a ball disposed on an inclined ball support surface. The ball support surface is adapted to bias the ball toward one side of the ball support surface thereby providing space for the ball to roll as the substrate supported thereon changes in length when exposed to thermal influences. In another embodiment, the apparatus further comprises a cage adapted to capture the ball to the ball support surface.

BRIEF DESCRIPTION OF THE DRAWINGS

A more particular description of the invention, briefly summarized above, may be had by reference to the embodiments thereof that are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, wherever possible, to designate identical elements that are common to the figures.

DETAILED DESCRIPTION

The invention generally relates to a spacer for supporting substrates that is advantageously suited to reduce substrate damage. Although the spacer is particularly useful in chambers where the substrate undergoes a change in temperature, the spacer is suitable for use in other chambers where avoidance of substrate scratching is desired.

Figure 1:
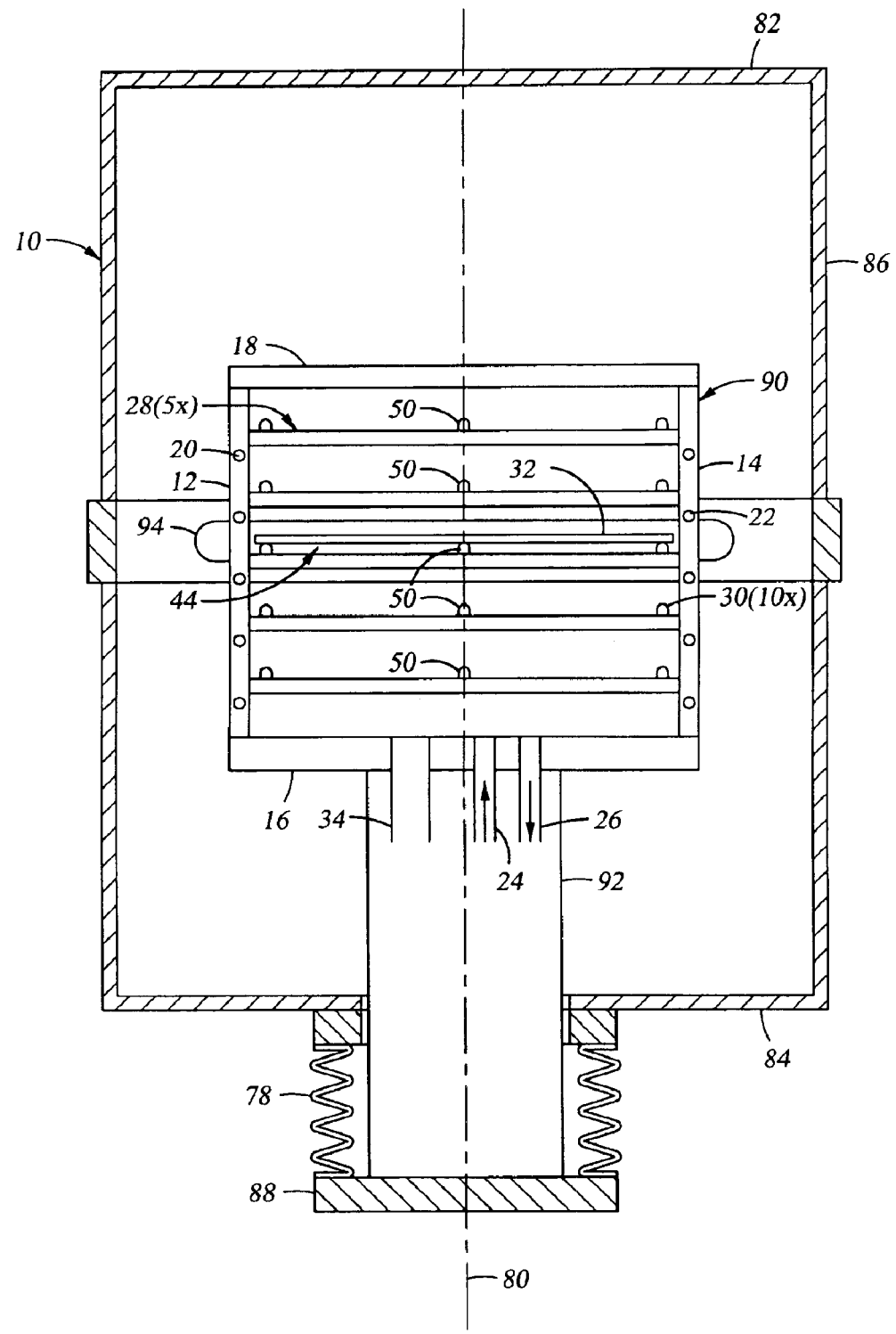
FIG. 1 is a sectional view of one embodiment of a heating chamber having a plurality of support members and spacers.
Figure 2:
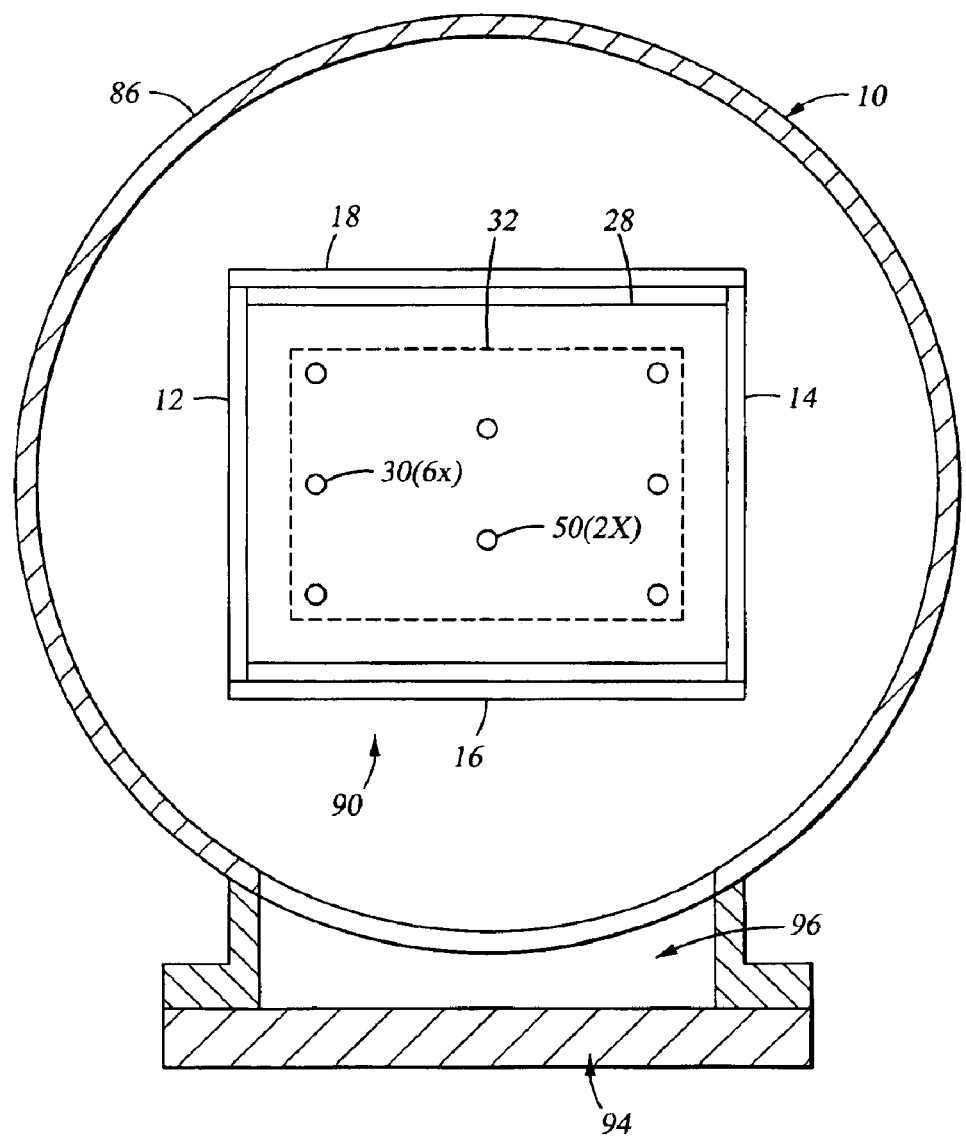
FIG. 2 is a plan view of one embodiment of a shelf/support member having a plurality of spacers disposed thereon.

FIGS. 1–2 are sectional side and top views of one embodiment of a heating chamber 10 having a cassette 90 for storing and/or thermally processing glass substrates 32. The heating chamber 10 includes a sidewall 86, top 82 and bottom 84 that house the cassette 90. A port 96 is formed through the sidewall 86 adjacent to a processing system (not shown) and is fitted with a slit valve 94 through which glass substrates 32 can be transferred between the processing system and the cassette 90 within the heating chamber 10.

The cassette 90 is movably supported within the heating chamber 10 by a shaft 92. The shaft 92 extends through the bottom 84 of the chamber 10 and is coupled to a lift mechanism 88 that controls the elevation of the cassette 90 within the chamber 10. A bellows 78 or other sealing element is disposed around the shaft 92 and maintains isolation of the chamber environment while facilitating movement of the cassette 90.

The cassette 90 comprises sidewalls 12, 14, a bottom 16 and a lid 18. The sidewalls 12, 14 of the cassette 90 are typically fitted with suitable heating elements 20, 22 for controlling the temperature of the cassette 90. The heating elements 20, 22 may be a resistive heater and/or a conduit for circulating a heat transfer gas or liquid.

In one embodiment, the bottom 16 of the cassette 90 includes inlet and outlet channels 24, 26 for routing of temperature controlled fluid through the heating elements 20, 22. A channel 34 may also be formed in the bottom 16 for routing sensor and/or power wires for heating elements 20, 22 that are connected to a power source (not shown).

A plurality of support members 28 are disposed between the sidewalls 12, 14. Each of the support members 28 is adapted to support one glass substrate 32 thereon. In the embodiment depicted in FIGS. 1–2, the support members 28 are thermally conductive shelves having opposing ends coupled to the walls 12, 14. The support members 28 are configured to make good thermal contact with the walls 12, 14, thereby allowing rapid and uniform control of the temperature of the support members 28 and glass substrate 32 disposed thereon by the heating members 20, 22. Examples of materials that may be used for the support members 28 include, but are not limited to, aluminum, copper, stainless steel, clad copper and the like. Alternatively, at least some of the heating members 20, 22 may be embedded in the support members 28.

As illustrated in FIG. 2, one or more outer spacers 30 are suitably arranged on the support member 28 to support the perimeter of the glass substrate 32 (shown in phantom). One or more inner spacers 50 are disposed on the support member 28 to support the inner portion of the glass substrate 32. In the embodiment depicted in FIG. 2, three outer spacers 30 are disposed on opposing sides of the support member 28 to support the perimeter of the glass substrate 32 while two inner spacers 50 are disposed inward of the outer spacers 30 to support a center portion of the glass substrate 32. Other configurations between the spacers 30, 50 may be alternatively utilized. For example, each of the outer spacers 30 may be radially aligned with at least one of the inner spacers 50 relative to a centerline 80 of the support member 28. Typically, the substrate 32 is supported centered over the centerline of the support member 28.

Returning primarily to FIG. 1, the spacers 30, 50 serve to support the glass substrates 32 within the cassette 90 so that there is a gap 44 defined between the support members 28 and the glass substrates 32. The gap 44 prevents direct contact of the support members 28 to the glass substrates 32, which might stress and crack the glass substrates 32 or result in contaminants being transferred from the support members 28 to the glass substrates 32. Glass substrates 32 within the cassette 90 are heated indirectly by radiation and gas conduction rather than by direct contact between the glass substrates 32 and the support members 28. Additionally, interleaving the glass substrates 32 and the support members 28 allows heating of the glass substrates 32 from both above and below, thus providing more rapid and uniform heating of the glass substrates 32.

Figure 3:
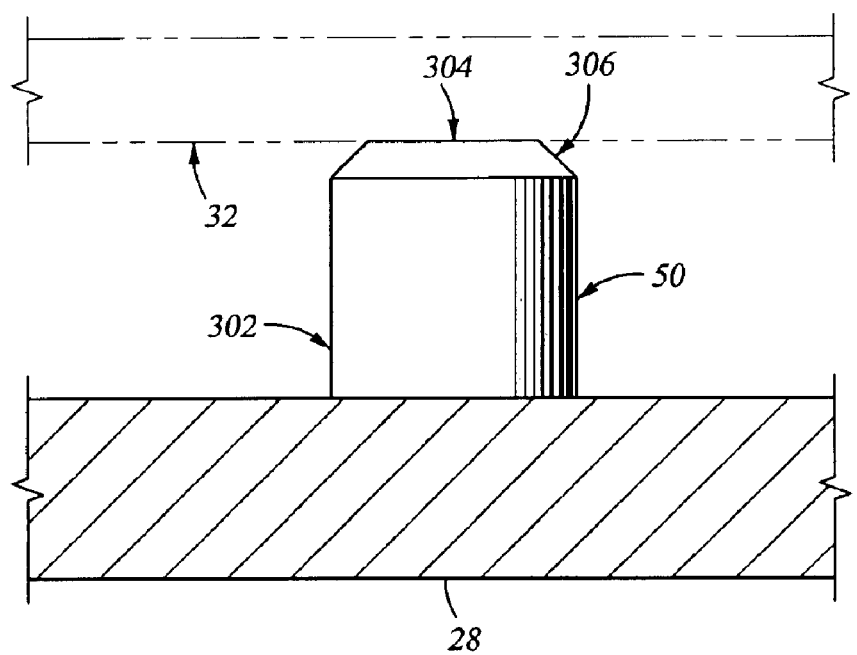
FIG. 3 is a side view of one embodiment of a conventional spacer.

FIG. 3 is a sectional view of one embodiment of the inner spacer 50. The inner spacer 50 is typically comprised of stainless steel and has a cylindrical form. The inner spacer 50 has a first end 302 and a second end 304. The first end 302 is disposed on the support member 28. The second end 304 supports the glass substrate 32 (shown in phantom) in a spaced-apart relation relative to the support member 28. The edge of the second end 304 typically includes a radius or chamfer 306 to minimize potential scratching of the glass substrate 32. The second end 304 may alternatively comprise a full radius to minimize the contact area with the glass substrate 32. Typically, the inner spacer 50 is configured to provide some friction to keep the glass substrate 32 stationary on the support member 28.

Figure 4A:
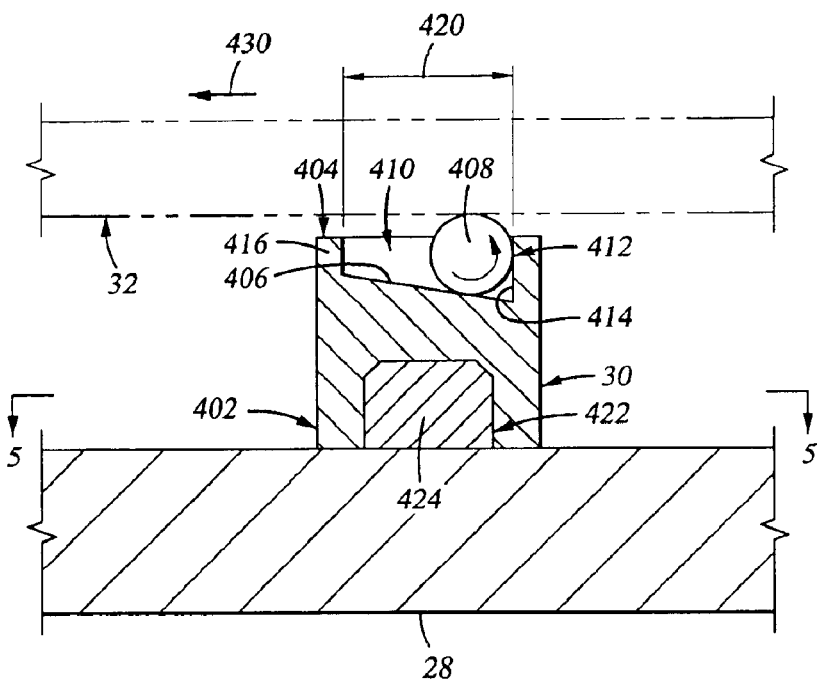
FIG. 4A is a sectional view of one embodiment of a spacer of the invention.

FIG. 4A is a sectional view of one embodiment of the outer spacer 30. The inner spacer 50 may optionally be configured similar to the outer spacer 30. Material used to form the outer spacer 30 may be selected for ease of fabrication, and in some embodiments, low costs. Some materials suitable for fabricating the outer spacer 30 include stainless steel, low carbon steel, ICONEL®, or nickel alloys among other materials.

The outer spacer 30 generally includes a first portion 402 and a second portion 404. The first portion 402 is disposed on the support member 28 and typically has a cylindrical cross section, although other geometries may be utilized. The second portion 404 includes a ball support surface 406 that supports a ball 408 thereon. The ball 408 contacts the glass substrate 32 and supports the substrate over the substrate support 28 and is biased toward one side of the ball support surface 406.

In one embodiment, the ball support surface 406 is a configured function as a biasing member and urge the ball 408 toward one side of the ball support surface 406. The ball support surface 406 may be flat or curved, and in one embodiment is inclined relative to a plane defined by the substrate support 28. The incline of the ball support surface 406 allows gravity to bias the ball 408 toward one side of the ball support surface 406. Typically, the ball support surface 406 is inclined toward the centerline 80 of the substrate support 28 at an angle of less than about 5 degrees. In the embodiment depicted in FIG. 4A, the ball support surface 406 is inclined between about 0.5 to about 1.5 degrees. The angle of incline may be determined by considering the relationship between the weight of the glass substrate 32 and the friction between the glass substrate 32 and support surface 406 to ensure rolling of the ball 408, which substantially prevents scratching of the glass substrate as the glass expands and contracts.

In one embodiment, the ball support surface 406 is defined at a bottom of a socket 410 formed in the second portion 404 of the outer spacer 30. The socket 410 includes a wall 412 having a taller portion 414 and a shorter portion 416. The taller portion 414 is typically oriented toward the centerline 80 of the substrate support 28 and may be at least as high as ½ the diameter of the ball 408 in applications where the substrate 32 is heated within the chamber 10. Conversely, the taller portion 414 may be oriented away from the centerline 80 in applications where the substrate 32 is cooled.

A distance 420 defined between the taller portion 414 and the shorter portion 416 of the wall 412 is generally configured to allow the ball 408 to travel a predefined distance across the ball support surface 408 as the substrate 32 expands or contracts due to changes in the temperature of the substrate 32. For example, a cool substrate 32 is placed on the ball 408 that is biased toward the centerline 80 of the substrate support 28 and heated on the substrate support 28. As the substrate 32 expands radially outward from its center, the substrate urges the ball 408 in a direction 430 radially outward from the centerline 80 of the substrate 32 and substrate support 28, causing the ball 408 to roll across the ball support surface 406 from the taller portion 414 to the shorter portion 416 of the wall 412. Since the distance 420 is selected to accommodate the movement of the ball 408 over the expected substrate expansion through a predetermined temperature rise of the substrate 32 while disposed on the substrate support 28, rolling contact between the ball 408 and the substrate 32 is advantageously ensured, thus preventing sliding contact between the ball 408 and the substrate 32 that may damage the substrate. In embodiments where a hot substrate is supported on the ball for cooling, the slope of the ball support surface is away from the center of the support member 28, so that the direction 430 illustrating the movement of the ball is towards the center of the support member 28 as the substrate contracts while cooling.

In one embodiment, the first portion 402 of the outer spacer 30 has a hollow 422 adapted to receive a mounting pin 424 projecting from the support member 28. The pin 424 positions the outer spacer 30 upon its representative support member 28 inside the cassette 90. Typically, the outer spacer 30 is orientated so that the incline of the ball support surface 406 is aligned with the centerline 80 as discussed above. The outer spacer 30 may be fixed in this orientation utilizing locking compounds, staking, press fitting, welding, riveting, screwing and the like. It is to be appreciated that other methods of attaching or fixing embodiments of the outer spacers 30 to the support member 28 are also contemplated.

Figure 5:
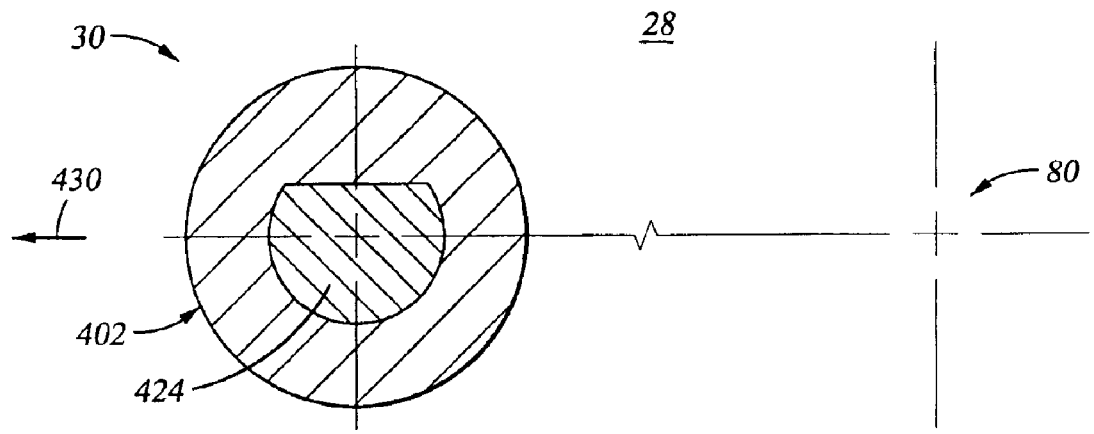
FIG. 5 is a sectional view of the spacer taken along section line 5—5 of FIG. 4A.

In the embodiment depicted in FIG. 4A and the sectional view of FIG. 5, the pin 424 and hollow 422 are keyed to mate in a predefined rotational orientation. In one embodiment, the pin 424 includes a flat 426 that mates against a land 428 projecting into the hollow 422 from the second portion 404 of the outer spacer 30. The interface between the flat 426 and land 428 ensures the spacer's orientation relative to the substrate support 30 and substrate positioned thereon. Other mating geometries are also contemplated to fix the angular orientation between the spacer 30 and support member 28.

Figure 4B:
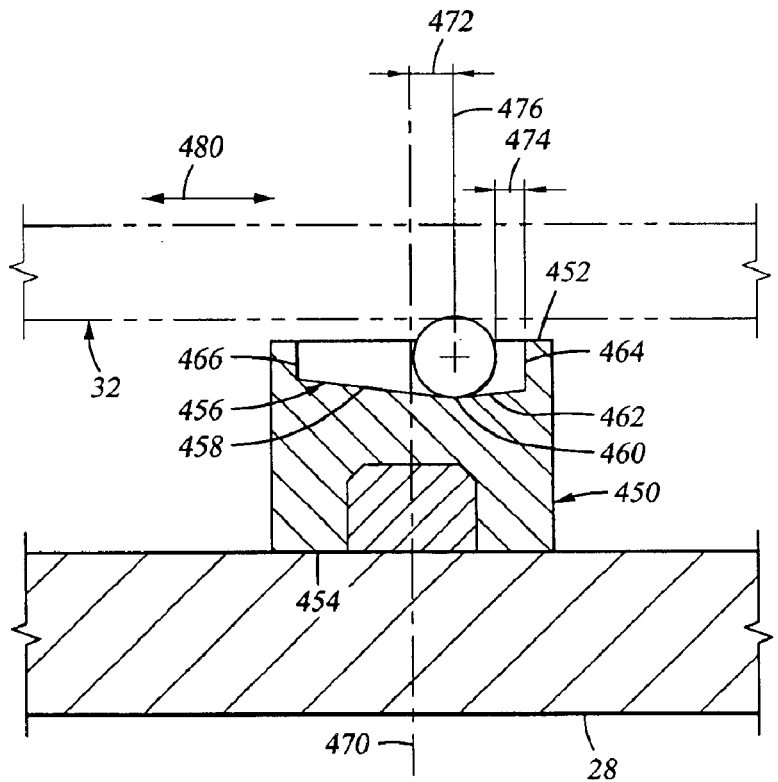
FIG. 4B is a sectional view of another embodiment of a spacer of the invention.

FIG. 4B is another embodiment of an outer spacer 450. The outer spacer 450 includes a top surface 452 and a bottom surface 454. The bottom surface 454 is adapted to mount on the support member 28. A ball support surface 456 is formed in the top surface 452 and is adapted to receive a ball 408 that supports the substrate 32 in a spaced apart relation relative to the top surface 452 of the spacer 450.

The ball support surface 456 includes a first inclined surface 458 coupled to a second inclined surface 462 by a curved surface 460. The first inclined portion 458 begins at a first side 466 of a recess 490 formed in the spacer 450 and defined by the ball support surface 456 and extends through a center line 470 of the spacer 450 to the curved surface 460. The curved surface 460 generally has a radius substantially equal to or greater than the radius of the ball 480 such that the ball support surface 456 positions the ball 408 in an orientation such that a center line 476 of the ball 408 is offset a distance 472 from the center line 470 of the spacer 450, thus allowing the ball 408 to freely roll in a direction 480 as the substrate 432 expands or contracts.

The second incline surface 462 extends from the curved surface 460 to a second wall 464 of the recess 490 and is configured such that the ball 408 is spaced a distance 474 from the second wall 464 when the ball is resting on the curved surface 460. The distance 474 allows the ball 408 to move along the second inclined portion 462 of the ball support surface 456 to accommodate slight movements of the substrate 32 relative to the shelf 28, such as vibrations or other unplanned motion, without damage to the substrate 32.

Figure 6:
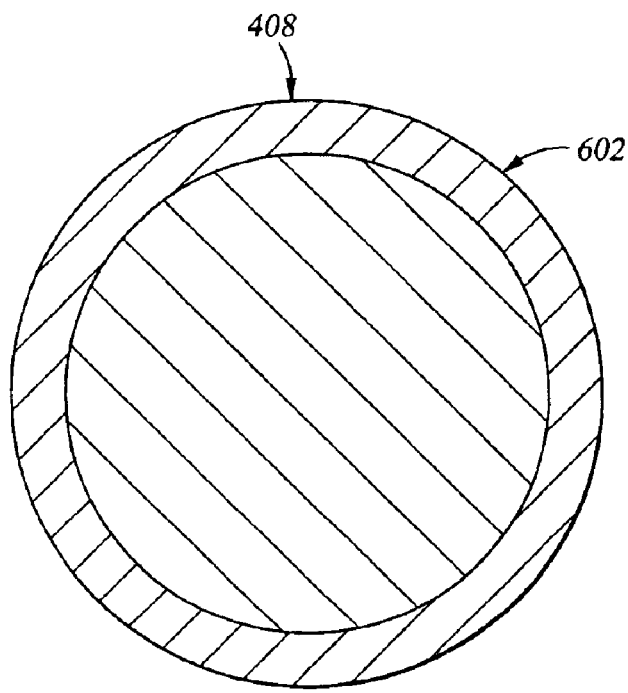
FIG. 6 is a sectional view of one embodiment of a ball.

FIG. 6 is a sectional view of one embodiment of the ball 408. Although the ball 408 is shown as a sphere, the ball 408 may alternatively be another shape configured to roll laterally on the ball support surface 406, such as a cylinder, an elliptical pin, a cam and the like. The ball 408 may be comprised of either metallic or non-metallic materials. The ball 408 may additionally provide friction reduction and/or inhibit chemical reactions between the ball 408 and the glass substrate 32. Typically, the ball 408 is comprised of a metal or metal alloy, quartz, sapphire, silicon nitride or other suitable non-metallic materials. In one embodiment, the ball 408 has a surface finish of 4 micro-inches or smoother.

Optionally, the ball 408 may be electropolished, coated or plated with a coating layer 602. For example, the coating layer 602 may have a sufficient thickness to provide a barrier layer that reduces friction between the ball 408 and the glass substrate 32. The reduced friction between the glass substrate 32 and the ball 408 substantially prevents damage to the glass substrate 32 caused by contact between the glass substrate 32 and the ball 408. The coating layer 602 may additionally or alternatively provide reduced chemical reactions between materials comprising the ball 408 and the glass substrate 32. In alternate embodiments, other portions of spacers 30, 50 may be coated similarly to reduce friction and/or chemical reaction therebetween.

The coating layer 602 capable of reducing or eliminating friction between the ball 408 and the glass substrate 32 may be deposited by means of chemical vapor deposition (CVD) nitration processes, physical vapor deposition (PVD) sputtering processes, spraying, plating or other processes. In one embodiment, the coating layer 602 has a thickness of at least about 3 microns. In another embodiment, the coating layer 602 is formed to a thickness from between about 3 microns to about 20 microns. In another example, the ball 408 as described above may be placed in a reaction chamber and exposed to an atmosphere comprising ammonia, and/or nitrogen, and/or hydrogen, and/or other reducing gasses to form a nitration coating layer upon the exposed surfaces of the ball 408. In another embodiment, the coating layer 602 is formed by a sputtering process such as PVD to form a nitrated surface on the outer surface of the ball 408 and comprises, for example, titanium nitride.

The surface coating layer 602 generally provides a smooth outer surface to ball 408. It is believed that the alternate embodiments described above of the surface coating layer 602 maintain a smooth surface at least as smooth as the original finish of the ball 408. Alternatively, the coating layer 602 may be processed, for example by electropolishing or other methods, to improve the finish of the coating layer 602. It is also believed that inner spacers 50, having a surface coating layer 602 described above, will reduce the friction between the glass substrate 32 supported on the inner spacer 50 and, in some embodiments, will also or alternatively reduce chemical reactions between contaminants within the ball 408 and/or the glass 32 disposed thereon. Optionally, the coating layer 602 may be applied to the outer spacer 30.

It is to be appreciated that an inner spacer 50 fabricated in accordance with aspects of the present invention is suited for heat treatment operations conducted above 250 degrees Celsius. Other heat treatment operations may also be performed using the inner spacer 50 of the present invention, such as the heat treatment processes used in the fabrication of low temperature polysilicon. It is believed that spacers 50 fabricated in accordance with the present invention are suited for heat treatment operations conducted above about 450 degrees Celsius, up to and including 600 degrees Celsius, depending upon the application and glass material properties. It is further believed that the surface coating layer 602 described above may provide an additional protective layer that both reduces the likelihood of friction damage between the ball 408 and the glass substrate 32 to be supported, while also acting as a barrier layer to prevent reaction between either contaminants or metals between the ball 408 and the glass substrate 32.

Embodiments of the inner spacer 50 have been shown and described above as a center support to reduce substrate damage. The embodiments described above illustrate an inner spacer 50 as a center support while conventional outer spacers 30 may be used for support of the periphery of glass substrate 32. It is to be appreciated that some or all of the outer spacers 30 may optionally be configured similar or identical to the inner spacers 50.

While the inner spacers 50 have been described with regard to particular materials, it is to be appreciated that other heat treatment applications may utilize spacers 50 fabricated from other, different materials, and may use alternative materials for coating layers 602 other than those described above.

Figure 7:
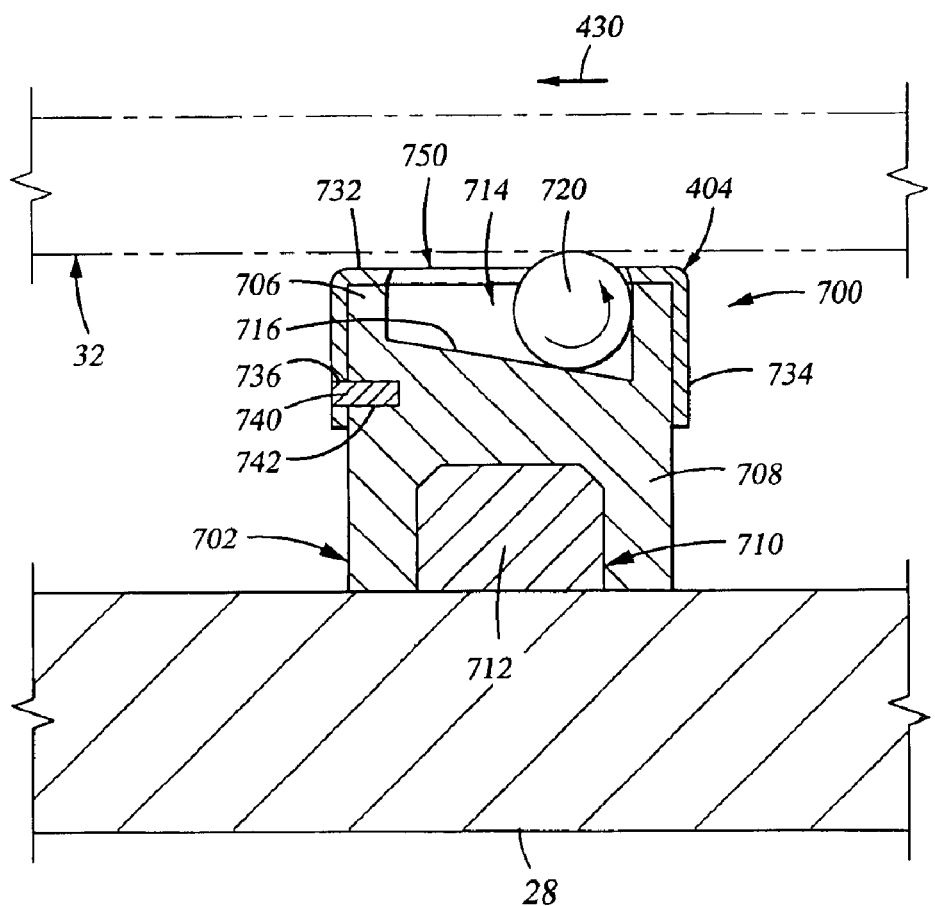
FIG. 7 is a sectional view of another embodiment of a spacer of the invention.
Figure 8:
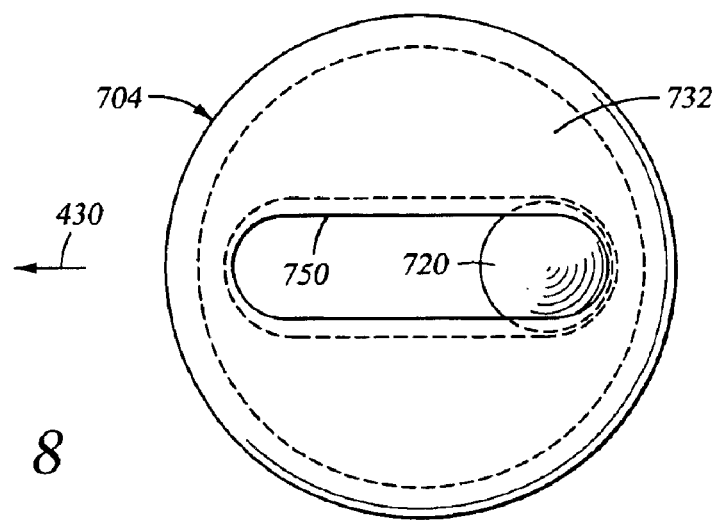
FIG. 8 is a top view of the spacer of FIG. 7.

FIGS. 7–8 depict another embodiment of an outer spacer 700. The outer spacer 700 includes a support body 702 having a ball 720 disposed thereon and captured thereto by a cage 704. A portion of the ball 720 extends through the cage 704 to support a substrate 730 in a spaced-apart relation relative to the support member 28.

The support body 702 is generally configured similar to the outer spacers described above and includes a first portion 708 and a second portion 706. The first portion 708 includes a hollow 710 that interfaces with a pin 712 extending from the support member 28. The hollow 710 and pin 712 are generally configured to orientate the spacer 700 such that the ball 720 moves in a direction 430 that is substantially aligned with the center of the substrate 32.

The second portion 706 includes a recess 714 in which a portion of the ball 720 is disposed. The recess 714 includes an inclined ball support surface 716 that biases a ball 720 toward one side of the outer spacer 700. The ball support surface 716 is disposed at a depth that ensures the ball 720 will support the substrate 32 without contacting the cage 704.

The cage 704 is coupled to the second portion 706 of the support body 702 and may be fabricated from a number of materials suitable for use at elevated temperatures, typically the same material as the support body 702. The cage 704 includes a top surface 732 having a circumscribing cylindrical flange 734 extending downwardly therefrom. A slot 750 is formed through the top 732 of the cage 704 and allows a portion of the ball 720 to extend therethrough. The slot 750 is typically orientated to allow the ball 740 to travel in a direction 430 aligned with a center of the substrate 32 as the substrate expands or contracts due to thermal influences.

The flange 734 of the cage 704 typically interfaces with the second portion 706 of the support body 702 to retain the cage 704 to the support body 702. The cage 704 may be coupled to the support body 702 by threading, adhering, riveting, staking, press fitting, brazing, welding, fastening or by other suitable methods. In the embodiment depicted in FIG. 7, at least one fastener 740 is disposed through a hole 736 formed through the flange 734 and into a hole 742 formed in the second portion 706 of the support body 702. The holes 736, 742 and fastener 740 ensures the alignment of the slot 750 to the direction 430. The fastener 740 may be a screw, dowel pin, spring pin, rivet, drive pin or other suitable device.

Figure 9:
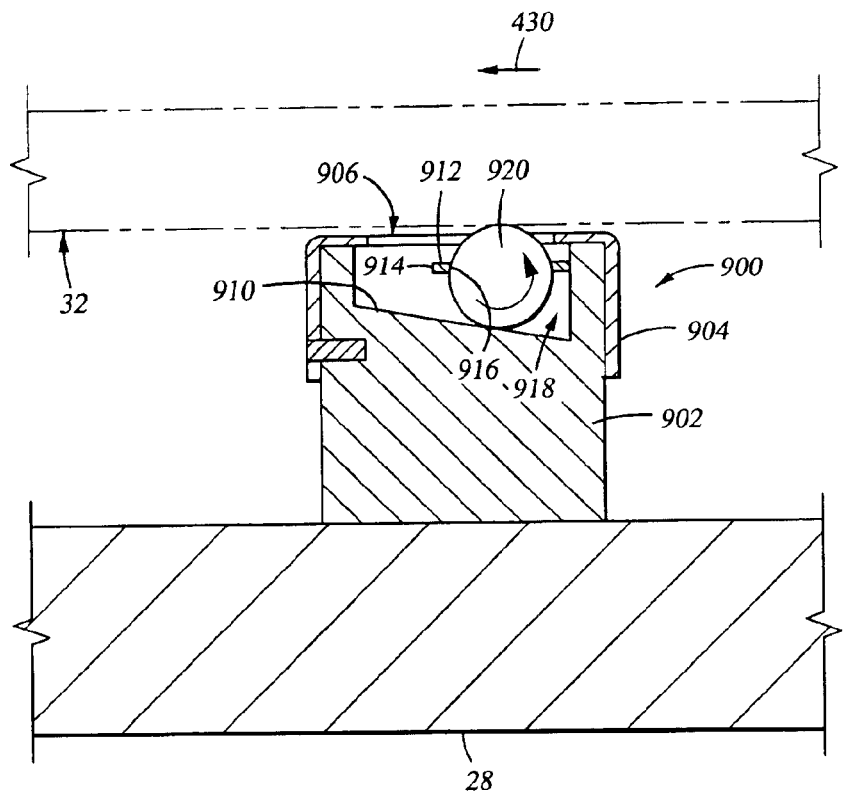
FIG. 9 is a sectional view of another embodiment of a spacer of the invention.
Figure 10:
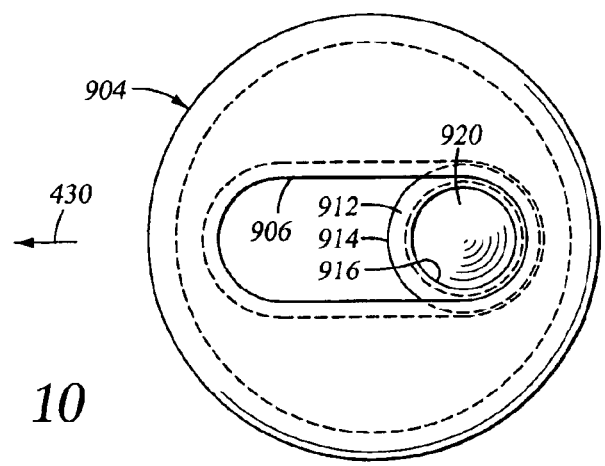
FIG. 10 is a top view of the spacer of FIG. 9.

FIGS. 9 and 10 depict another embodiment of an outer spacer 900. The outer spacer includes a support body 902 having a cage 904 coupled thereto. The support body 902 and the cage 904 are substantially similar to those of the outer spacer 700 described above, except that a slot 906 formed in the cage 904 has a width substantially equal to or greater than a diameter of a ball 920 retained by the cage 904 supported on an inclined ball support surface 910 disposed at the bottom of a recess 918 formed in the support body 902. A washer 912 is disposed between the ball 920 and the cage 904 and has an outer diameter 914 greater than a width of the slot 906, thereby retaining the ball 920 within the recess 918 formed in the support body 902. An inner diameter 916 of the washer 912 has a diameter sufficient to allow the perimeter of the ball 920 to extend above the cage 904, thereby maintaining the substrate 932 in a spaced-apart relation relative to the support member 28.

Figure 11:
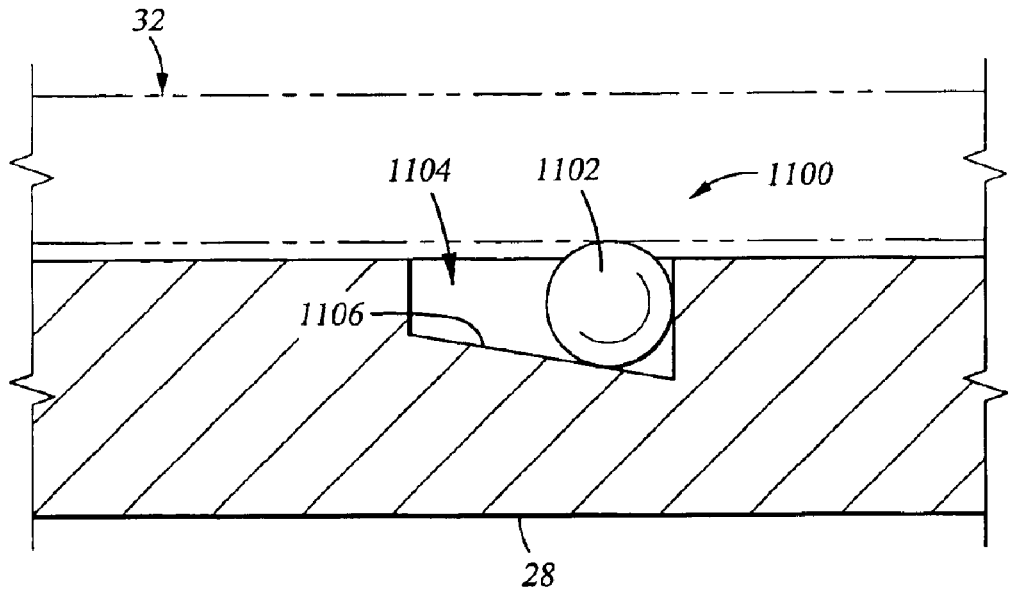
FIG. 11 is a sectional view of another embodiment of a spacer of the invention.

FIG. 11 depicts another embodiment of an outer spacer 1100. The outer spacer 1100 includes a ball 1102 disposed in a recess 1104 formed in the support member 28. The recess 1104 is configured substantially similar to the recesses formed in the outer spacers described above and includes an inclined ball support surface 1106 configured to bias the ball toward one side of the recess 1104. The depth of the recess 1104 is configured such that the perimeter of the ball 1102 extends above the surface of the support member 28, thereby maintaining the substrate 32 in a spaced-apart relation relative to the support member 28.

Figure 12:
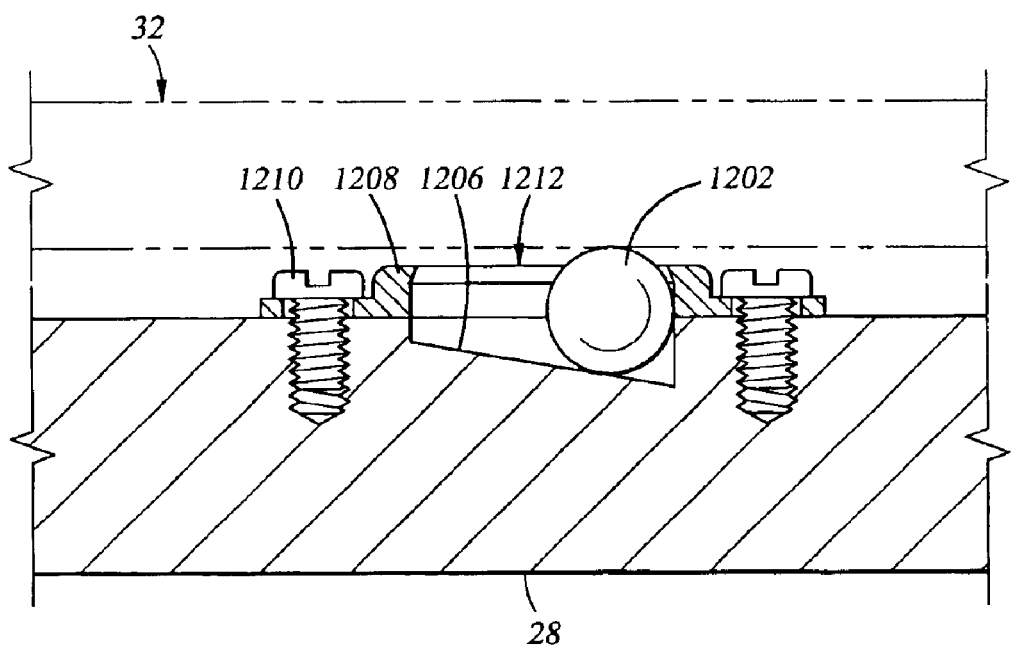
FIG. 12 is a sectional view of another embodiment of a spacer of the invention.

FIG. 12 depicts another embodiment of an outer spacer 1200. The outer spacer 1200 is configured similar to the outer spacer 1100, having a ball 1202 disposed on a ball support surface 1206 disposed at the bottom of a recess 1204 formed in a support member 28. The ball 1202 is retained in the recess 1204 by a cage 1208 coupled to the support member 28. The cage 1208 may be fastened to the support member 28 by welding, braising, screws, rivets, staking, adhering, bonding, riveting or by other suitable methods or devices. In the embodiment depicted in FIG. 12, the cage 1208 is fastened to the support member 28 by a plurality of fasteners 1210 threaded into the support member 28.

A slot 1212 formed through the cage 1208 may be configured to directly retain the ball 1202, as described with reference to the embodiments of FIGS. 7 and 8, or, alternatively, utilize a washer (not shown in FIG. 12), as described with reference to the embodiments of FIGS. 9 and 10.

Figure 13:
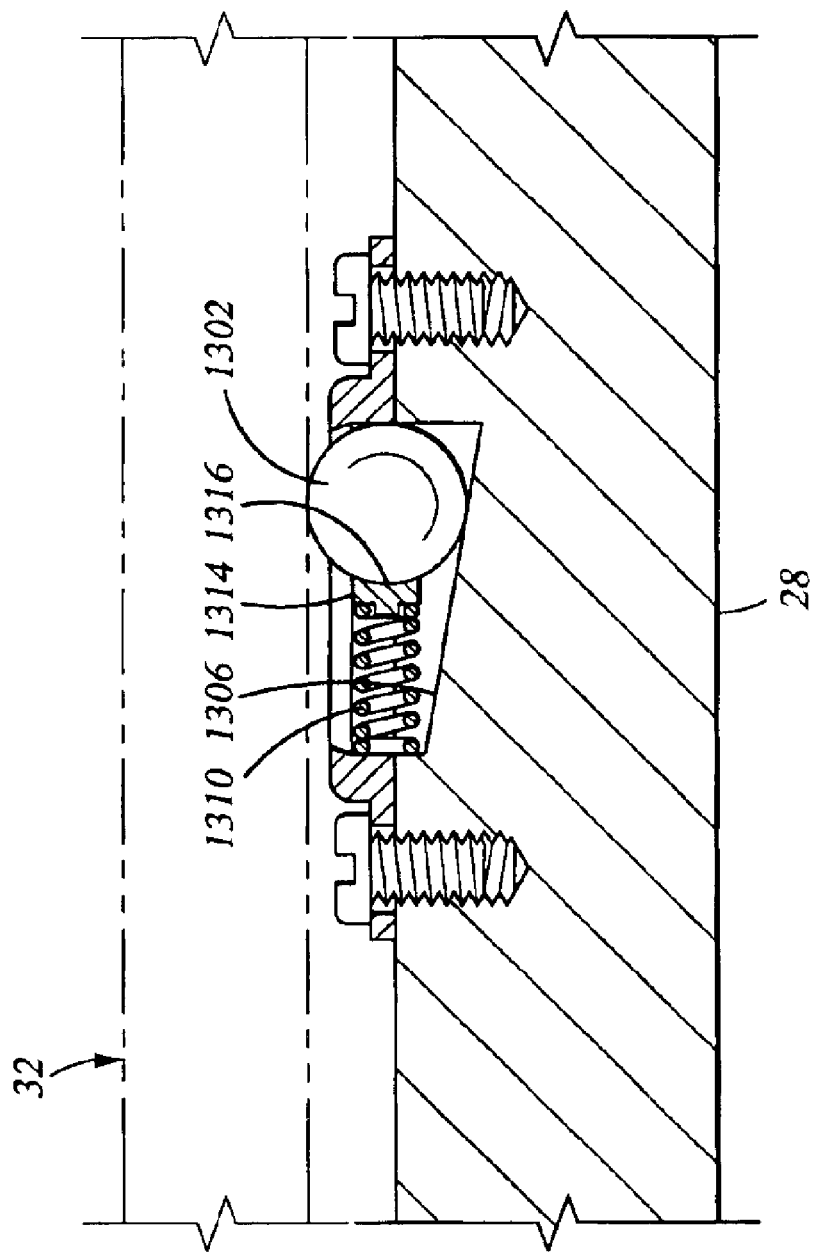
FIG. 13 is a sectional view of another embodiment of a spacer of the invention.

FIG. 13 depicts another embodiment of an outer spacer 1300. The outer spacer 1300 is configured similar to the outer spacer described above, having a ball 1302 disposed on a ball support surface 1306. The ball support surface 1306 may be flat or curved, inclined or substantially parallel to the substrate 32 (shown in phantom) supported by the ball 1302. The ball support surface 1306 may be formed in a spacer or substrate support, and may interact with a cage to retain the ball 1302 as described above.

A biasing member 1310 urges the ball 1302 toward one side of the ball support surface 1306. The biasing member 1310 includes a spring 1312 coupled to a slider 1314. The slider 1314 is typically fabricated from a material that allows the ball 1302 to slide across a contact surface 1316 of the slider 1314 as the ball 1302 rolls laterally across the ball support surface 1306 as the substrate expands or contracts. The spring 1312, shown in FIG. 13 as a compression spring, may alternatively be a flat spring or other spring form or device that allows the ball 1302 to roll as the substrate changes length while returning the ball 1302 to a predetermined slide of the ball support surface 1306 when the substrate is removed.

While the invention has been described for use with glass substrates 32, other embodiments of the inner spacers of the present invention may be used to reduce friction damage and/or chemical reaction between the inner spacers and different substrate materials. While the invention has been described as used in the heating system 10 described above, other heat treatment systems and chambers may be used. Methods and apparatus of the present invention may be practiced independently and irrespective of the type of chamber in which the embodiment of the present invention is employed.

Figure 14:
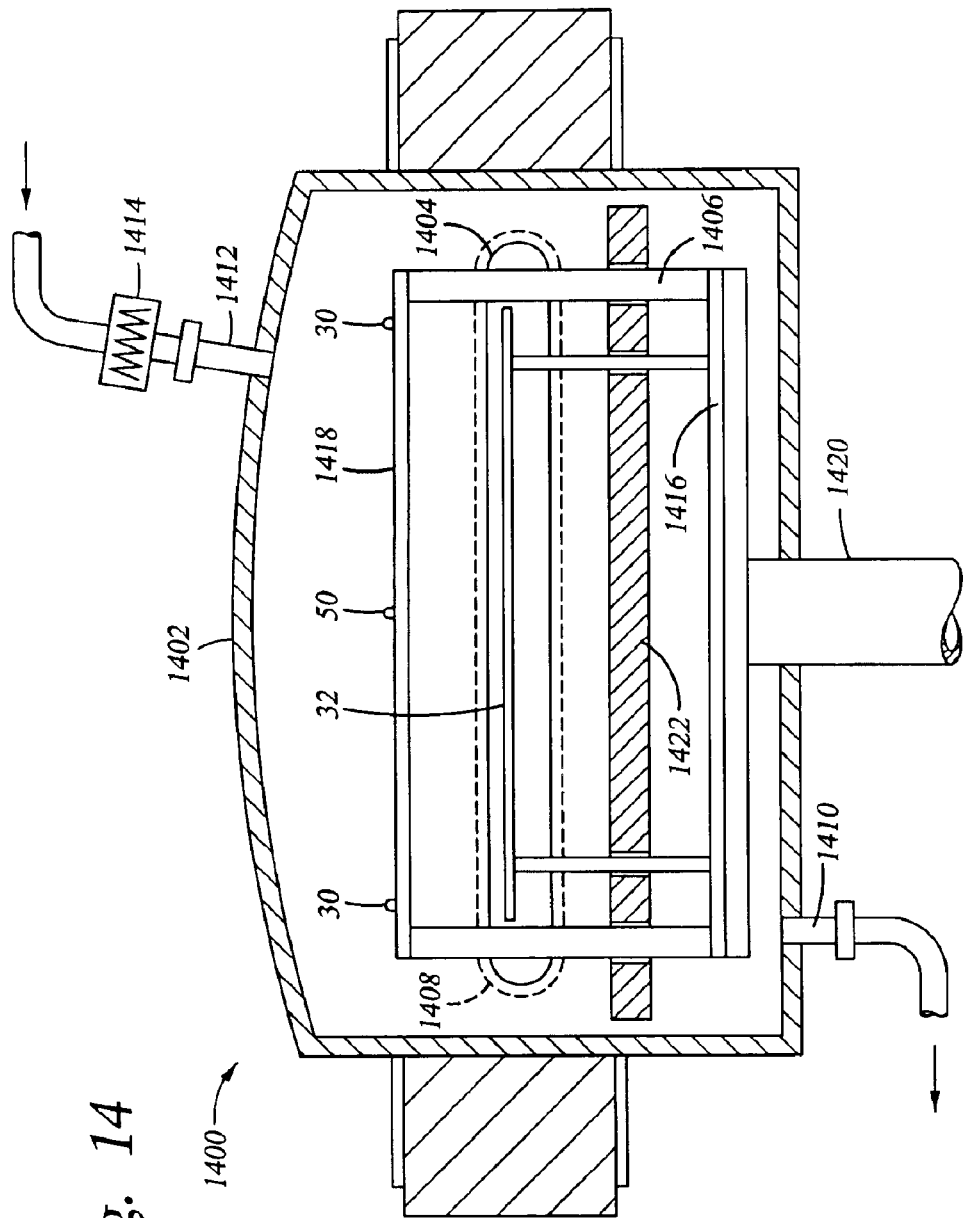
FIG. 14 is a sectional view of one embodiment of a load lock chamber of a support member having a plurality of spacers disposed thereon.

FIG. 14 depicts a sectional view of one embodiment of a load lock chamber 1400 and at least one inner spacer 50 disposed therein. The load lock chamber 1400 generally includes a chamber body 1402 having two glass transfer ports 1404 (only one is shown in FIG. 14). Each glass transfer port 1404 is selectively sealed by a slit valve 1408 (shown in phantom). The load lock chamber 1400 is disposed between a first atmosphere and a vacuum atmosphere, contained, for example, in chambers (not shown) coupled respectively to the transfer ports 1404, and is utilized to permit transfer of the glass substrate 32 into and out of the vacuum atmosphere through adjacent transfer ports 1404 without loss of vacuum.

The chamber body 1402 additionally includes a pumping port 1410 through which pressure within the chamber body 1402 may be regulated. Optionally, the chamber body 1402 may include a vent 1412 for raising the pressure within the chamber body 1402 from vacuum conditions. Typically, the air or fluid entering the chamber 1400 through the vent 1412 is passed through a filter 1414 to minimize the particles entering the chamber 1400. Such filters are generally available from Camfil-Farr, Inc., located in Riverdale, N.J.

A cassette 1406 is movably disposed in the chamber body 1402 and comprises a lower plate 1416 and an upper plate 1418 coupled to an elevator shaft 1420. The cassette 1406 is configured to support a first substrate 32 on one or more spacers 30 and at least one spacer 50 extending from the lower plate 1416 and a second substrate (not shown) supported on one or more spacers 30 and at least one spacer 50 extending from the upper plate 1418. The cassette 1406 may be raised or lowered to align any one of the substrates supported on the cassette 1406 with the ports 1404.

The chamber body 1402 may also include a cooling plate 1422. The cooling plate 1422 has a plurality of holes that allow the spacers 30, 50 extending from the lower plate 1416 to pass therethrough. As the cassette 1406 is lowered, the substrate 32 seated on the spacers 30, 50 is moved closer to the cooling plate 1422. A heat transfer fluid circulating through the cooling plate 1422 removes heat transferred from the substrate 32 to the cooling plate 1422, thereby reducing the temperature of the substrate 32. Thus, the spacer 50 allows the substrate 32 to expand or contract within the load lock 1400 without marring or otherwise damaging the substrate. One load lock chamber that may be adapted to benefit from the invention is described in U.S. patent application Ser. No. 09/464,362, filed Dec. 15, 1999, which is hereby incorporated by reference in its entirety.

Figure 15:
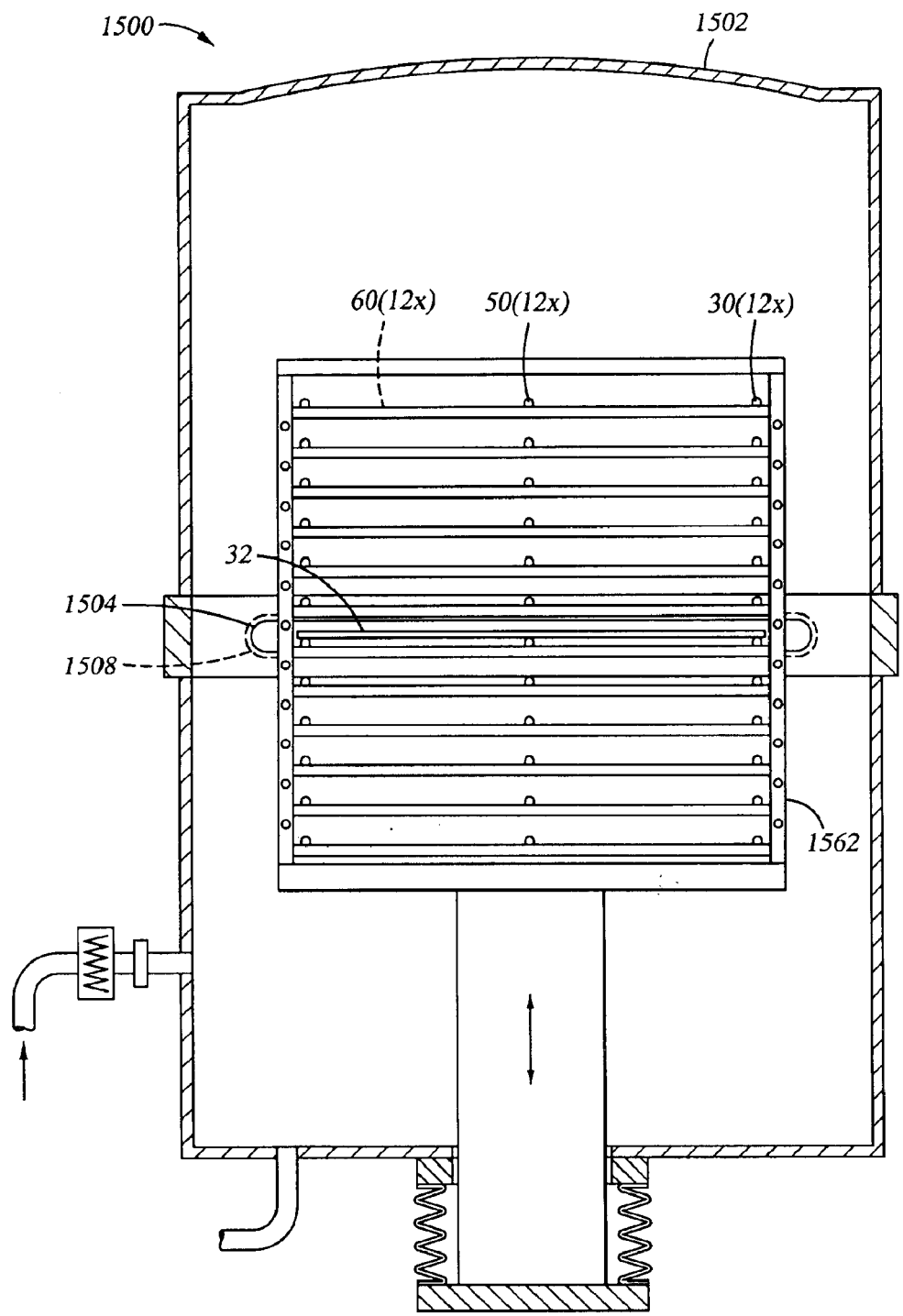
FIG. 15 is a sectional view of another embodiment of a load lock chamber of a support member having a plurality of spacers disposed thereon.

FIG. 15 depicts a sectional view of another embodiment of a load lock chamber 1500 and at least one inner spacer 50 disposed therein. The load lock chamber 1500 generally includes a chamber body 1502 having two glass transfer ports 1504 (only one is shown in FIG. 15). Each glass transfer port 1504 is selectively sealed by a slit valve 1508 (shown in phantom). The load lock chamber 1500 is disposed between a first atmosphere and a vacuum atmosphere, contained, for example, in chambers (not shown) coupled respectively to the transfer ports 1504, and is utilized to permit transfer of the glass substrate 32 (shown in phantom) into and out of the vacuum atmosphere through adjacent transfer ports 1504 without loss of vacuum.

A plurality of substrates 32 are each supported within the chamber body 1502 on support members 1560 (only one substrate 32 is shown in FIG. 15 for clarity). The support members 1560 may be coupled to the chamber body 1502 or disposed within a movable cassette 1562. In the embodiment depicted in FIG. 15, a movable cassette 1562 includes at least one inner spacer 30 and plurality of outer spacers 50 coupled to twelve (12) vertically stacked support members 1560. Thus, as the substrate 32 expands or contracts, the substrate 32 can move over the spacer 50 without marring or otherwise damaging the substrate. One load lock chamber that may be adapted to benefit from the invention is available from AKT, a division of Applied Materials, of Santa Clara, Calif.

Thus, an apparatus for supporting a substrate having a ball disposed on an included support surface has been provided. The apparatus is adapted to minimize damage between the substrate support and the substrate supported thereon during thermal expansion (or contraction) of the substrate as the inclined ball support surface is configured to position the ball to ensure the ball is able to roll unimpeded in the direction urged by the substrate's movement.

While the foregoing is directed to embodiments of the present invention, other and further embodiments of the invention may be devised without departing from the basic scope thereof, and the scope thereof is determined by the claims that follow.

What is claimed is:

1. Apparatus for supporting a substrate in a chamber having at least one substrate support member disposed in the chamber, comprising:
    a support surface;
    a roller disposed on the support surface and adapted to move laterally thereon, the roller adapted to contact and support the substrate in a spaced apart relation to the substrate support member, the roller biased to one side of the support surfaces;
    a support member having an upper surface: and
    a plurality of spacers disposed on the upper surface, at least one of the spacers having the roller support surface formed therein and supporting the roller thereon.

2. The apparatus of claim 1, wherein the support surface is oriented at an angle between about 0.5 to about 2 degrees from horizontal.

3. The apparatus of claim 1 further comprising:
    a cage retaining the roller to the support surface, the cage having an upwardly facing slot through which a portion of the roller extends.

4. The apparatus of claim 3 further comprising:
a washer disposed between the roller and the top of the cage and having an outer diameter greater than a width of the slot.

5. The apparatus of claim 1, wherein the support member is heated.

6. The apparatus of claim 1, wherein the roller support surface is curved.

7. The apparatus of claim 1 wherein the spacers are keyed to the support member to fix the orientation of the spacers relative to the support member.

8. The apparatus of claim 1 further comprising
a cage coupled to the spacer and retaining the roller to the support surface, the cage having an upwardly facing slot through which a portion of the roller extends.

9. The apparatus of claim 8 further comprising:
a washer disposed between the roller and the top of the cage and having a diameter greater than a width of the slot.

10. The apparatus of claim 1, wherein the roller is biased toward a center of the substrate support member.

11. The apparatus of claim 1 further comprising:
a biasing member contacting the roller and urging the roller laterally.

12. The apparatus of claim 11, wherein the biasing member further comprises:
a spring; and
a contact member urged against the roller by the spring.

13. The apparatus of claim 1, wherein the roller is a sphere, an elliptical pin or a cam.

14. The apparatus of claim 1, wherein the support surface further comprises:
a first inclined surface; and
a second inclined surface coupled to the first inclined surface where the second inclined surface has a shorter roller supporting length than the first inclined surface.

15. The apparatus of claim 14, wherein the first and second inclined surfaces are coupled by a curved surface.

16. The apparatus of claim 14, wherein the roller can travel along the first and second inclined surfaces.

17. Apparatus for supporting a substrate comprising:
a support member having a top surface;
a plurality of rollers disposed around a perimeter of the top surface and adapted to support the substrate thereon in a spaced-apart relation relative to the top surface, the rollers biased away from the perimeter of the top surface; and
a plurality of spacers, each spacer having a lower end coupled to the support member and an upper end having the roller support surface formed therein.

18. The apparatus of claim 17, wherein the roller support surface is formed in the support member.

19. The apparatus of claim 17, wherein the roller support surface is curved.

20. The apparatus of claim 17, further comprising:
a cage capturing the roller to the roller supporting surface and having a slot formed therein, a portion of the roller extending through the slot and movable laterally across the roller support surface.

21. The apparatus of claim 20 further comprising:
a washer that is disposed between the roller and cage, the washer having an outer diameter greater than a width of the slot.

22. The apparatus of claim 20, wherein the cage and spacer mate to align the roller supporting surface and the slot in a predefined orientation.

23. The apparatus of claim 20 further comprising:
a washer that is disposed between the roller and cage, the washer having an outer diameter greater than a width of the slot.

24. The apparatus of claim 17, wherein the rollers are coated plated or electropolished.

25. The apparatus of claim 17, wherein the rollers are coated or plated chromium, an aluminum alloy, silicon nitride, or tungsten nitride.

26. The apparatus of claim 17 further comprising:
a heating element thermally coupled to the support member.

27. The apparatus of claim 17 further comprising:
a plurality of spacers, each spacer having recess formed therein, the recess having a bottom surface that urges the roller into a first position closer to one side of the recess, wherein the roller when in first position is spaced from walls of the recess.

28. Apparatus for supporting a glass substrate, comprising:
a chamber body;
at least one support member disposed within the chamber body;
a plurality of spacers each having a lower portion disposed on the support member and an upper portion;
a recess formed in the upper portion of at least one of the spacers; and
a roller disposed in the recess and adapted to roll laterally across the recess.

29. The apparatus of claim 28, wherein the support member further comprises a heating element thermally coupled thereto.

30. The apparatus of claim 28, wherein the recess further comprises an inclined roller support surface.

31. The apparatus of claim 29, wherein the roller support surface is curved.

32. The apparatus of claim 28, wherein the rollers disposed in the recesses are adapted to move laterally in directions aligned through a common reference point.

33. The apparatus of claim 28, wherein the lower portion is keyed to the support member to rotationally align the spacer in a predefined orientation.

34. The apparatus of claim 28, wherein the chamber body is a thermal treatment chamber.

35. The apparatus of claim 28, wherein the chamber body further comprises:
a first substrate transfer port disposed on a first sidewall; and
a second substrate transfer port disposed on a second sidewall.

36. The apparatus of claim 28 further comprising:
a cage capturing the roller to the spacer; and
a slot formed through the cage and having a portion of the roller extending therethrough.

37. The apparatus of claim 36, further comprising:
a washer that is disposed between the roller and cage, the washer having an outer diameter greater than a width of the slot.

38. Apparatus for supporting a glass substrate, comprising:
a processing chamber;
a plurality of heated support members have an upper surface disposed in the chamber;
a plurality of spacers disposed on each support member, each of the spacers having an upper portion and a lower portion, the lower portion coupled to the upper surface support member; and a roller disposed on the upper portion of at least two of the spacers disposed on opposite sides of the upper surface of the support member and biased toward a center of the support member, the roller adapted to support the glass substrate in a spaced-apart relation to the support member.

39. The apparatus of claim 38, wherein the processing chamber is thermal treatment chamber.

40. The apparatus of claim 38 further comprising:

a cage capturing the roller to the spacer and having an upwardly facing slot formed therein allowing a portion of the roller to extend therethrough and move laterally away from the center of the support member.

41. The apparatus of claim 39 further comprising:

a washer that is disposed between the roller and cage, the washer having an cuter diameter greater than a width of the slot.

42. Apparatus for supporting a glass substrate, comprising:

a load lock chamber having a first substrate transfer port disposed in a first sidewall and second substrate transfer port disposed in a second sidewall;

at least one support member disposed in the load lock chamber;

a plurality of spacers disposed on the support member, each of the spacers having an upper portion and a lower portion, the lower portion coupled to the support member; and a recess formed in the upper portion of at least one of the spacers; and a roller disposed in the recess and adapted to roll laterally across the recess.

43. The apparatus of claim 42 further comprising:

a cage capturing the roller to the upper portion of the spacer and having an upwardly facing slot formed therein allowing a portion of the roller to extend therethrough and move laterally across the roller.

44. The apparatus of claim 43 further comprising:

a washer that is disposed between the roller and cage, the washer having an outer diameter greater than a width of the slot.

45. A method for supporting a substrate comprising:

biasing a roller toward a side of a roller support surface of a support member assembly;

placing a substrate on the roller; and thermally treating the substrate wherein the thermally treating step causes the substrate to expand or contract, thereby rolling the roller away from the side of the roller support surface.

46. The method of claim 45, wherein the step of thermally treating further comprises:

heating the substrate.

47. The method of claim 45, wherein the step of thermally treating further comprises:

changing a pressure within a load lock chamber containing the support member assembly.

48. A method for supporting a substrate comprising:

supporting a substrate on a plurality of balls each respectively disposed on a roller support surface; and changing the temperature of the substrate to cause the roller to roll laterally across the roller support surface from a starting position.

49. The method of claim 48 further comprising:

removing the substrate from the rollers; and biasing the balls to return to the starting position.

50. Apparatus for supporting a substrate in a chamber having at least one substrate support member disposed in the chamber, comprising:

a support surface;

a roller disposed on the support surface and adapted to move laterally thereon, the roller adapted to contact and support the substrate in a spaced apart relation to the substrate support member, the roller biased to one side of the support surface; and a biasing member contacting the roller and urging the roller laterally.

51. The apparatus of claim 50, wherein the support surface is oriented at an angle between about 0.5 to about 2 degrees from horizontal.

52. The apparatus of claim 50 further comprising:

a cage retaining the roller to the support surface, the cage having an upwardly facing slot through which a portion of the roller extends.

53. The apparatus of claim 52 further comprising:

a washer disposed between the roller and the top of the cage and having an outer diameter greater than a width of the slot.

54. The apparatus of claim 50, wherein the roller support surface is disposed in a heated support member.

55. The apparatus of claim 50, wherein the roller support surface is curved.

56. The apparatus of claim 50 further comprising:

a spacer having the roller support surface formed therein; and a support member, wherein the spacers are keyed to the support member to fix the orientation of the spacers relative to the support member.

57. The apparatus of claim 50 further comprising:

a spacer having the roller support surface formed therein; and a cage coupled to the spacer and retaining the roller to the support surface, the cage having an upwardly facing slot through which a portion of the roller extends.

58. The apparatus of claim 57 further comprising:

a washer disposed between the roller and the top of the cage and having a diameter greater than a width of the slot.

59. The apparatus of claim 50, wherein the roller is biased toward a center of the substrate support member.

60. The apparatus of claim 50, wherein the biasing member further comprises:

a spring; and a contact member urged against the roller by the spring.

61. The apparatus of claim 50 wherein the roller is a sphere, an elliptical pin or a cam.

62. The apparatus of claim 50, wherein the support surface further comprises:

a first inclined surface; and a second inclined surface coupled to the first inclined surface where the second inclined surface has a shorter ball supporting length than the first inclined surface.

63. The apparatus of claim 62, wherein the first and second inclined surfaces are coupled by a curved surface.

64. The apparatus of claim 62, wherein the ball can travel along the first and second inclined surfaces.

65. Apparatus for supporting a substrate in a chamber having at least one substrate support member disposed in the chamber, comprising:

a support surface having a first inclined surface and a second inclined surface coupled to the first inclined surface, where the second inclined surface has a shorter ball supporting length than the first inclined surface; and a roller disposed on the support surface and adapted to move laterally thereon, the roller adapted to contact and support the substrate in a spaced apart relation to the substrate support member, the roller biased to one side of the support surface.

66. The apparatus of claim 65, wherein the first and second inclined surfaces are coupled by a curved surface.

67. The apparatus of claim 65, wherein the roller can travel along the first and second inclined surfaces.

68. The apparatus of claim 65 further comprising:

a cage retaining the roller to the support surface, the cage having an upwardly facing slot through which a portion of the roller extends.

69. The apparatus of claim 68 further comprising:

a washer disposed between the roller and the top of the cage and having an outer diameter greater than a width of the slot.

70. The apparatus of claim 65, wherein the roller support surface is disposed in a heated support member.

71. The apparatus of claim 65, wherein the roller support surface is curved.

72. The apparatus of claim 65 wherein the spacers are keyed to the support member to fix the orientation of the spacers relative to the support member.

73. The apparatus of claim 65 further comprising:

a spacer having the support surface formed therein.

74. The apparatus of claim 73 further comprising:

a cage coupled to the spacer and retaining the roller to the support surface, the cage having an upwardly facing slot through which a portion of the roller extends.

75. The apparatus of claim 74 further comprising;

a washer disposed between the roller end the top of the cage and having a diameter greater than a width of the slot.

76. The apparatus of claim 65, wherein the roller is a sphere, an elliptical pin or a cam.

77. Apparatus for supporting a substrate comprising:

a support member having a top surface, a plurality of rollers disposed around a perimeter of the top surface and adapted to support the substrate thereon in a spaced-apart relation relative to the top surface, the rollers biased away from the perimeter of the top surface;

a plurality of spacers coupled to the support member;

a roller supporting surface formed in each spacer and supporting one of the rollers; and a cage coupled to each spacer and capturing the roller to the spacer, wherein the cage has a slot formed therethrough, wherein a portion of the roller extends through the slot.

78. The apparatus of claim 77, wherein the roller supporting surface of formed in each spacer is inclined.

79. The apparatus of claim 77, wherein the roller supporting surface of formed in each spacer is curved.

80. The apparatus of claim 77 further comprising:

a washer that is disposed between the roller and cage, the washer having an outer diameter greater than a width of the slot.

81. The apparatus of claim 77, wherein the cage and spacer mate to align the roller supporting surface and the slot in a predefined orientation.

82. The apparatus of claim 77, wherein the rollers are coated, plated or electropolished.

83. The apparatus of claim 77, wherein the rollers are coated or plated chromium, an aluminum alloy, silicon nitride, or tungsten nitride.

84. The apparatus of claim 77 further comprising:

a heating element thermally coupled to the support member.

85. The apparatus of claim 77, wherein each spacer further comprises:

a recess formed therein, the recess having a bottom surface that urges the ball into a first position closer to one side of the recess, wherein the ball when in first position is spaced from walls of the recess.

86. The apparatus for supporting a substrate comprising;

a support member having a top surface;

a plurality of rollers disposed around a perimeter of the top surface and adapted to support the substrate thereon in a spaced-apart relation relative to the top surface, the rollers biased away from the perimeter of the top surface; and a plurality of spacers, each spacer having recess formed therein, the recess having a bottom surface that urges the roller into a first position closer to one side of the recess, wherein the roller when in first position is spaced from walls of the recess.

87. The apparatus of claim 86, wherein the bottom surface of the recess is inclined.

88. The apparatus of claim 86 further comprising:

a cage capturing the roller to the spacer and having a slot formed therein, a portion of the roller extending through the slot and movable laterally across the recess.

89. The apparatus of claim 88 further comprising:

a washer that is disposed between the roller and cage, the washer having an outer diameter greater than a width of the slot.

90. The apparatus of claim 86, wherein the rollers are coated, plated or electropolished.

91. The apparatus of claim 86, wherein the rollers are coated or plated chromium, an aluminum alloy, silicon nitride, or tungsten nitride.

92. The apparatus of claim 86, further comprising:

a heating element thermally coupled to the support member.

* * * * *

UNITED STATES PATENT AND TRADEMARK OFFICE
CERTIFICATE OF CORRECTION

PATENT NO. : 6,917,755 B2
DATED : February 27, 2003
INVENTOR(S) : Andrew Nguyen et al.

It is certified that error appears in the above-identified patent and that said Letters Patent is hereby corrected as shown below:

<u>Title page,</u>
Item [57], ABSTRACT,
Line 5, after "an apparatus for supporting a substrate includes" add -- a --.

<u>Column 10,</u>
Line 53, change "surfaces" to -- surface --.

<u>Column 12,</u>
Line 6, insert a comma after "coated".

<u>Column 13,</u>
Line 18, change "cuter" to -- outer --.

Signed and Sealed this

Twenty-fifth Day of April, 2006

JON W. DUDAS
*Director of the United States Patent and Trademark Office*

UNITED STATES PATENT AND TRADEMARK OFFICE
CERTIFICATE OF CORRECTION

PATENT NO. : 6,917,755 B2  
DATED : July 12, 2005  
INVENTOR(S) : Andrew Nguyen et al.

It is certified that error appears in the above-identified patent and that said Letters Patent is hereby corrected as shown below:

<u>Title page,</u>  
Item [57], ABSTRACT,  
Line 5, after "an apparatus for supporting a substrate includes" add -- a --.

<u>Column 10,</u>  
Line 53, change "surfaces" to -- surface --.

<u>Column 12,</u>  
Line 6, insert a comma after "coated".

<u>Column 13,</u>  
Line 18, change "cuter" to -- outer --.

This certificate supersedes Certificate of Correction issued April 25, 2006.

Signed and Sealed this

Twenty-third Day of May, 2006

JON W. DUDAS  
*Director of the United States Patent and Trademark Office*